(12) United States Patent
Kimura

(10) Patent No.: US 11,194,249 B2
(45) Date of Patent: Dec. 7, 2021

(54) MOLDING APPARATUS FOR MOLDING COMPOSITION ON SUBSTRATE WITH MOLD, AND ARTICLE MANUFACTURING METHOD

(71) Applicant: CANON KABUSHIKI KAISHA, Tokyo (JP)

(72) Inventor: Atsushi Kimura, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 16/419,920

(22) Filed: May 22, 2019

(65) Prior Publication Data

US 2019/0377259 A1  Dec. 12, 2019

(30) Foreign Application Priority Data

Jun. 11, 2018 (JP) .............................. JP2018-111218

(51) Int. Cl.
*G03F 7/00* (2006.01)
*B29C 59/00* (2006.01)
(Continued)

(52) U.S. Cl.
CPC ............ *G03F 7/0002* (2013.01); *B29C 59/00* (2013.01); *B29C 59/002* (2013.01); *B29C 59/02* (2013.01); *B29C 59/022* (2013.01); *B29C 59/026* (2013.01); *B29C 59/04* (2013.01); *B29C 59/046* (2013.01); *B29C 59/16* (2013.01); *G03F 7/161* (2013.01); *G03F 7/7065* (2013.01); *G03F 7/7085* (2013.01); *G03F 7/70483* (2013.01); *G03F 7/70491* (2013.01); *G03F 7/70616* (2013.01); *G03F 7/70808* (2013.01); *G03F 7/70908* (2013.01); *G03F 7/70916* (2013.01); *G03F 9/7049* (2013.01); *G03F 9/7069* (2013.01); *G03F 9/7076* (2013.01)

(58) Field of Classification Search
CPC ..... B29C 59/02; B29C 59/022; B29C 59/026; B29C 59/002; B29C 59/16; B29C 59/04; B29C 59/046; G03F 7/0002; G03F 7/161; G03F 7/70808; G03F 7/70483; G03F 7/70908; G03F 7/70916; G03F 7/7085; G03F 7/70491; G03F 7/70616; G03F 7/7065; G03F 9/7049; G03F 9/7076; G03F 9/7069
USPC ......... 118/669; 264/293, 40.1; 425/385, 150
See application file for complete search history.

(56) References Cited

U.S. PATENT DOCUMENTS

| | | | |
|---|---|---|---|
| 2013/0015598 A1* | 1/2013 | Kimura | B82Y 10/00 264/40.1 |
| 2016/0223918 A1* | 8/2016 | Asano | G03F 9/7042 |
| 2017/0008219 A1* | 1/2017 | Asano | G03F 7/0002 |

FOREIGN PATENT DOCUMENTS

JP  2007-299994 A  11/2007

* cited by examiner

Primary Examiner — Joseph S Del Sole
Assistant Examiner — Lawrence D. Hohenbrink, Jr.
(74) Attorney, Agent, or Firm — Canon U.S.A., Inc. IP Division

(57) ABSTRACT

A molding apparatus that molds a composition on a substrate with a mold includes a mold holding unit configured to hold the mold, a substrate holding unit configured to hold the substrate, a first elastic member configured to apply a first elastic force to the mold holding unit in a direction away from the substrate holding unit, and a control unit configured to cause the mold holding unit to move in the direction away from the substrate holding unit in a case where the control unit determines that an abnormality has occurred.

14 Claims, 8 Drawing Sheets

(51) Int. Cl.
*B29C 59/02* (2006.01)
*G03F 7/20* (2006.01)
*G03F 9/00* (2006.01)
*B29C 59/04* (2006.01)
*G03F 7/16* (2006.01)
*B29C 59/16* (2006.01)

MOLDING APPARATUS FOR MOLDING COMPOSITION ON SUBSTRATE WITH MOLD, AND ARTICLE MANUFACTURING METHOD

BACKGROUND

Field

The present disclosure relates to a molding apparatus that molds a composition on a substrate with a mold, and an article manufacturing method.

Description of the Related Art

With a growing demand for miniaturization in semiconductor devices, Micro Electro Mechanical Systems (MEMS), and the like, in addition to existing photolithography, a microfabrication technique in which an imprint material is molded on a substrate with a mold and the composition of the imprint material is formed on the substrate has been attracting attention. This technique is called an imprint technique. With this imprint technique, a minute structure in a size of nanometers can be formed on a substrate.

For example, a light-curing method is known as one of the imprint techniques. In an imprint apparatus that employs the light-curing method, a photo-curable imprint material is first coated on a shot region, which is an imprint region on a substrate. Next, a pattern portion of a mold (mask) is brought into contact with (pressed against) the imprint material while the pattern portion of the mold and the shot region are aligned with each other, and the pattern portion is filled with the imprint material. Then, the imprint material is cured by irradiating with light, and the pattern portion of the mold is removed from the imprint material, so that the composition of the imprint material is formed on the shot region of the substrate.

The imprint apparatus is required to accurately align the pattern portion of the mold with the shot region on the substrate so as to accurately form the composition of the imprint material.

Japanese Patent Application Laid-Open No. 2007-299994 discusses a technique in which a pattern portion of a mold and an imprint material are brought into contact with each other by inclining the mold or a substrate so that the mold is parallel to the substrate in consideration of the flatness of each of the mold and the substrate.

In Japanese Patent Application Laid-Open No. 2007-299994, when the pattern portion of the mold and the imprint material on the substrate are brought into contact with each other, the position of a mold holding portion that holds the mold and the position of a substrate holding portion that holds the substrate are controlled to align the pattern portion of the mold with the shot region on the substrate. However, when controlling the position of the mold holding portion or the substrate holding portion, an abnormality may occur in the control operation. If the abnormality occurs, it is difficult to accurately control the position of the mold held by the mold holding portion, or the position of the substrate held by the substrate holding portion. As a result, the mold and the substrate come into contact with each other, which may cause a damage to the mold or the substrate.

SUMMARY

The present disclosure is directed to providing a molding apparatus and an article manufacturing method which are capable of preventing a damage to a mold or a substrate.

A molding apparatus according to an aspect of the present disclosure is a molding apparatus that molds a composition on a substrate with a mold, the molding apparatus including a mold holding unit configured to hold the mold, a substrate holding unit configured to hold the substrate, a first elastic member configured to apply a first elastic force to the mold holding unit in a direction away from the substrate holding unit, and a control unit configured to cause the mold holding unit to move in the direction away from the substrate holding unit in a case where the control unit determines that an abnormality has occurred.

Further features of the present disclosure will become apparent from the following description of exemplary embodiments with reference to the attached drawings.

BRIEF DESCRIPTION OF THE DRAWINGS

FIG. 4 illustrates a mold holding unit, an elastic member, a control unit, and the like.

FIG. 6 illustrates a substrate holding unit, the elastic member, the control unit, and the like.

DESCRIPTION OF THE EMBODIMENTS

Figure 1:
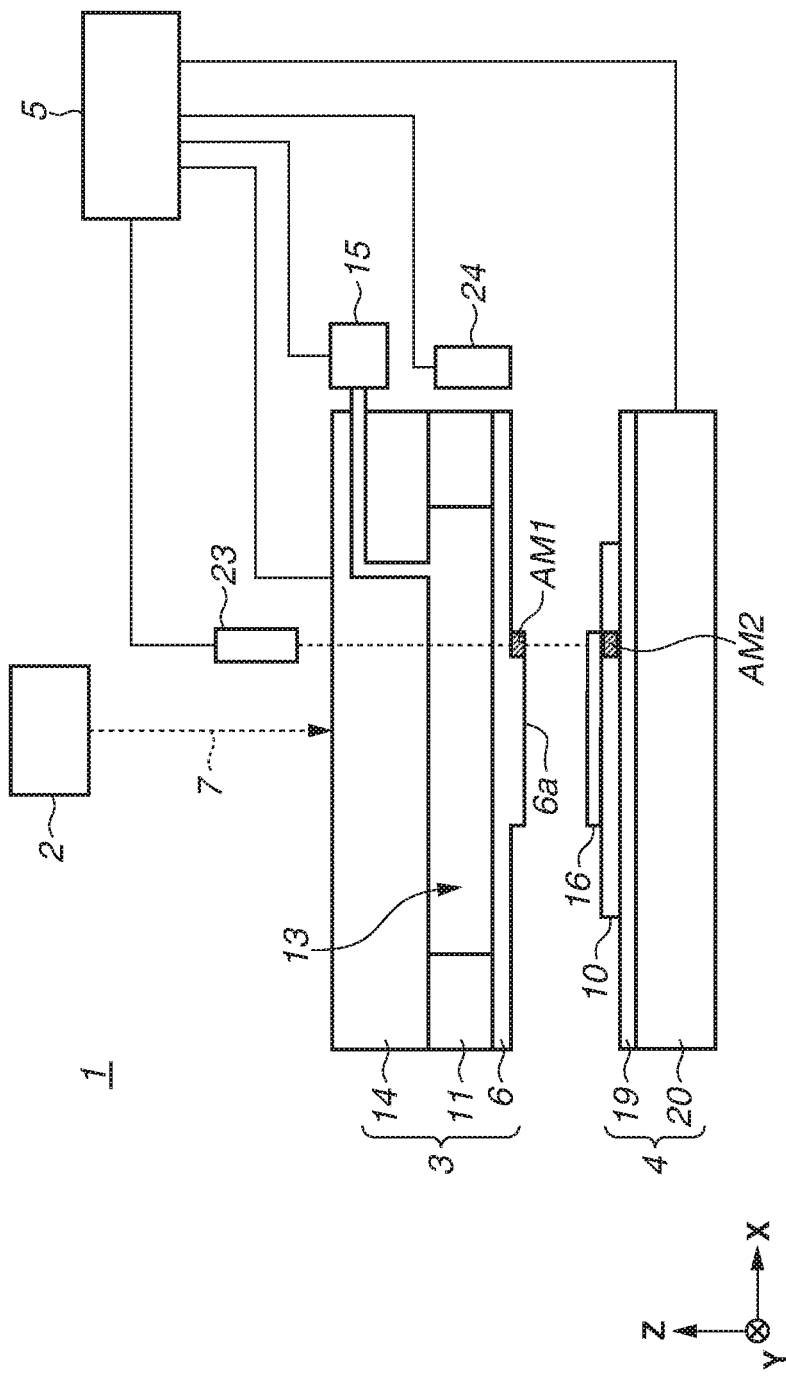
FIG. 1 illustrates an imprint apparatus according to a first exemplary embodiment.

Exemplary embodiments of the present disclosure will be described in detail below with reference to the accompanying drawings. In the drawings, the same members are denoted by the same reference numerals, and redundant descriptions are omitted.

A first exemplary embodiment illustrates an example in which an imprint apparatus that forms a pattern on a substrate is employed as a molding apparatus that molds a composition on a substrate with a mold. FIG. 1 illustrates the imprint apparatus according to the first exemplary embodiment. An imprint apparatus 1 (molding apparatus) brings an imprint material supplied onto a substrate 10, into contact with a mold 6 (mask, template). Further, a curing energy is applied to the imprint material to mold a composition of a cured material to which a concave-convex pattern of the mold 6 is transferred.

In this case, a curable composition (also referred to as an uncured imprint material) that is cured when the curing energy is applied thereto is used as the imprint material. An electromagnetic wave, heat, or the like is used as the curing energy. The electromagnetic wave is, for example, light, such as infrared light, visible light, or ultraviolet light, which is selected from a wavelength in a range from 10 nm to 1 mm The curable composition is a composition that is cured by the irradiation with light or by heating. As one of such compositions, a photo-curable composition which is cured by light contains at least a polymerizable compound and a photopolymerization initiator, and may contain a non-polymerizable compound or a solvent as needed. The non-polymerizable compound is at least one of compounds selected from a group including a sensitizer, a hydrogen donor, an internal mold release agent, a surfactant, an oxidation inhibitor, and a polymer component.

The imprint material is applied onto the substrate in the form of a film by a spin coater or a slit coater. Alternatively, the imprint material may be applied by a liquid ejection head onto the substrate in the form of a droplet or in the form of an island or a film formed by connecting a plurality of droplets. The viscosity (viscosity at 25° C.) of the imprint material is, for example, in a range from 1 mPa·s to 100 mPa·s.

Glass, ceramic, metal, semiconductor, resin, or the like is used for the substrate 10, and as needed, a member made of a material different from the substrate 10 may be formed on a surface of the substrate 10. Specific examples of the substrate 10 include a monocrystalline silicon substrate, a Silicon on Insulator (SOI) substrate, a compound semiconductor wafer, and a glass substrate containing quartz as a material. The glass substrate may be a substrate for manufacturing a replica mask from a master mask by an imprint process.

The mold 6 includes a pattern portion 6a which has a rectangular outer peripheral shape and has a pattern formed in a three-dimensional shape (a concave-convex pattern, such as a circuit pattern, to be transferred to the substrate 10) on a surface opposed to the substrate 10. The pattern portion 6a is disposed on a convex portion on the surface opposed to the substrate 10. The length of the convex portion on which the pattern portion 6a is disposed in a direction vertical to the surface opposed to the substrate 10 (a distance from the surface of the pattern portion 6a to the peripheral surface of the pattern portion 6a) is, for example, 30 μm. The mold 6 is composed of a material that can transmit light, such as quartz. The mold 6 may have a concave portion, which is called a cavity, on the opposite side of the pattern portion 6a.

The present exemplary embodiment illustrates a case where the imprint apparatus 1 employs a light curing method for curing an imprint material by irradiating the imprint material with light. In the following description, the direction parallel to an optical axis of light irradiated on the imprint material on the substrate by an irradiation unit, which is described below, is a Z-axis direction, and two directions orthogonal to each other within a plane vertical to the Z-axis direction are an X-axis direction and a Y-axis direction, respectively. A downward direction is referred to as a −Z-axis direction, and an upward direction is referred to as a +Z-axis direction.

Each unit of the imprint apparatus 1 will be described with reference to FIG. 1. A mold holding mechanism 3 includes a fixing unit 14, a mold chuck (mold holding unit) 11 that holds the mold 6 by attracting the mold 6 using a vacuum suction force or electrostatic force, and a mold moving unit 12 (not illustrated in FIG. 1) that moves the mold chuck 11. Each of the fixing unit 14, the mold chuck 11, and the mold moving unit 12 has an opening at a central portion (inside) so that light from an irradiation unit 2 is irradiated on an imprint material 16 formed on the substrate 10. The opening, the mold chuck 11, and the mold 6 held by the mold chuck 11 form a space 13. The mold moving unit 12 is disposed between the mold chuck 11 and the fixing unit 14. The mold moving unit 12 moves the mold 6 (mold chuck 11) in the Z-axis direction so as to selectively perform an operation (mold pressing) of pressing the mold 6 against the imprint material 16 on the substrate 10, or an operation (mold releasing) of releasing the mold 6 from the imprint material 16 on the substrate 10. Examples of an actuator applicable to the mold moving unit 12 include a linear motor and an air cylinder. The mold moving unit 12 may be composed of a plurality of drive systems, such as a coarse motion drive system and a fine motion drive system, so as to accurately position the mold 6. Further, the mold moving unit 12 may be configured to move the mold 6 not only in the Z-axis direction, but also in the X-axis direction and the Y-axis direction. Furthermore, the mold moving unit 12 may be configured to include a tilt function for adjusting the position of the mold 6 in the direction of θ (rotation about the Z-axis) and the inclination of the mold 6. The position of the mold chuck 11 is measured by a first measurement unit 25 (not illustrated in FIG. 1). Examples of the first measurement unit 25 include a laser interferometer and an encoder. A structure, such as a bar mirror or a scale, which is used for measurement by the first measurement unit 25, is disposed on the mold chuck 11. A control unit 5, which is described below, controls the mold moving unit 12 by using the measurement result obtained by the first measurement unit 25.

The irradiation unit 2 includes a light source (not illustrated) and an irradiation optical system (not illustrated). The irradiation optical system includes a combination of optical elements to be described below. In the imprint process (molding process), the irradiation unit 2 irradiates the imprint material 16 on the substrate 10 with light 7 (e.g., ultraviolet light) through the mold 6. The irradiation unit 2 includes the light source and optical elements (such as a lens, a mirror, and a light-shielding plate) for adjusting the light from the light source to assume a light state (such as a light intensity distribution or an illumination region) appropriate for the imprint process. Since the light curing method is employed in the present exemplary embodiment, the imprint apparatus 1 includes the irradiation unit 2. If a thermal curing method is employed, the imprint apparatus 1 includes a heat source for curing the imprint material 16 (thermosetting imprint material), instead of the irradiation unit 2.

An alignment scope 23 measures a positional deviation in each of the X-axis direction and the Y-axis direction of an alignment mark AM1 formed on the mold 6 and an alignment mark AM2 formed on the substrate 10. The alignment scope 23 can also measure the shape of the pattern portion of the mold 6 and the shape of the shot region formed on the substrate 10.

A discharge unit 24 discharges the imprint material 16 based on information about a preliminarily set supply amount, and supplies the imprint material 16 onto the substrate 10. The supply amount of the imprint material 16 to be supplied from the discharge unit 24 is set depending on, for example, the thickness of the pattern of the imprint material 16 formed on the substrate 10, the density of the pattern of the imprint material 16, or the like.

A substrate holding mechanism 4 includes a substrate chuck (substrate holding unit) 19 that holds the substrate 10 by attracting the substrate 10 using an attraction force, and a substrate stage 20 that enables the substrate 10 to move in the X-axis direction and in the Y-axis direction. The substrate chuck 19 holds the substrate 10 by attracting the substrate 10 using a vacuum suction force or electrostatic force. The substrate chuck 19 is mounted on the substrate stage 20. The substrate holding mechanism 4 is movable within an XY plane. The position of the substrate holding mechanism 4 is adjusted when the pattern portion of the mold 6 is pressed against the imprint material 16 formed on the substrate 10, thereby aligning the position of the mold 6 with the position of the substrate 10. The substrate holding mechanism 4 is also provided with a substrate moving unit 21 (not illustrated in FIG. 1) that enables the substrate chuck 19 holding the substrate 10 to move in the Z-axis direction. Examples of an actuator applicable to the substrate moving unit 21 include a linear motor and an air cylinder. Pressing and releasing of the mold 6 in the imprint apparatus 1 are implemented by moving the mold 6 in the Z-axis direction. Pressing and releasing of the mold 6 may also be implemented by moving the substrate 10 in the Z-axis direction. Further, pressing and releasing of the mold 6 may be implemented by moving both the mold 6 and the substrate 10 relatively to each other in the Z-axis direction. The substrate holding mechanism 4 may be configured to include a tilt function for adjusting the position of the substrate 10 in the direction of θ (rotation about the Z-axis) and the inclination of the substrate 10. The position of the substrate holding mechanism 4 is measured by a second measurement unit 26 (not illustrated in FIG. 1). Examples of the second measurement unit 26 include a laser interferometer and an encoder. A structure, such as a bar mirror or a scale, which is employed to carry out a measurement by the second measurement unit 26, is disposed on the substrate holding mechanism 4. The control unit 5, which is described below, controls the substrate moving unit 21 by using the measurement result obtained by the second measurement unit 26.

A pressure adjustment unit 15 adjusts the pressure in the space 13 to deform the pattern portion 6a of the mold 6 held by the mold chuck 11 into a convex shape in a direction (−Z-axis direction) toward the substrate 10, or to restore a planar shape of the pattern portion 6a. For example, the pressure adjustment unit 15 adjusts the pressure in the space 13 to be higher than a surrounding pressure so that the pattern portion 6a of the mold 6 is deformed into each convex shape before the pattern portion 6a of the mold 6 contacts the imprint material 16 on the substrate 10. Further, the pressure adjustment unit 15 adjusts the pressure in the space 13 to be equal to the surrounding pressure so that the planar shape of the pattern portion 6a of the mold 6 is restored after the pattern portion 6a of the mold 6 contacts the imprint material 16 on the substrate 10. This adjustment makes it possible to prevent a gas from being left in the pattern portion 6a of the mold 6, so that the concave-convex portion of the pattern portion 6a can be filled with a larger amount of the imprint material 16. In addition, a pressure measurement unit (not illustrated) for measuring the pressure in the space 13 is provided.

The control unit 5 is composed of a computer including a central processing unit (CPU) and a memory, and controls the operation, adjustment, and the like of each unit of the imprint apparatus 1 based on programs stored in the memory. The control unit 5 may be composed of one or more computers. Further, the control unit 5 may be integrally formed with the imprint apparatus 1 (in a common housing), or may be formed separately from the imprint apparatus 1 (in separate housings).

Figure 2:
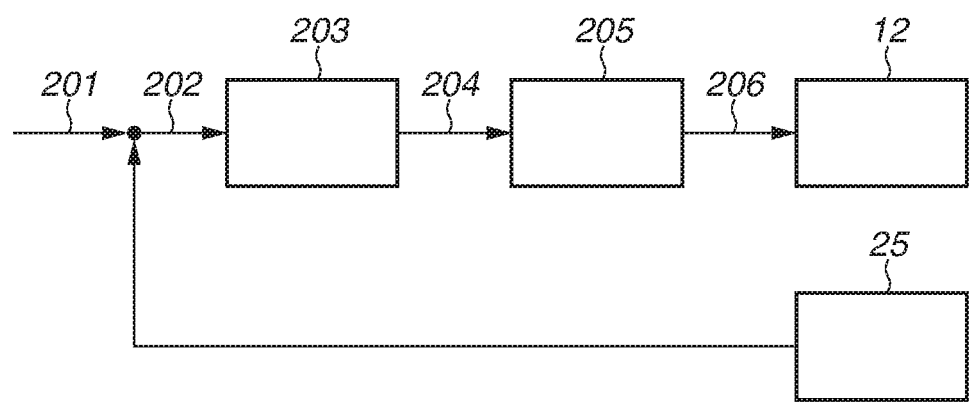
FIG. 2 illustrates control blocks of a mold moving unit.

Next, an operation in which the control unit 5 controls the mold moving unit 12 will be described. FIG. 2 illustrates control blocks of the mold moving unit 12. The control unit 5 generates a target position 201 for controlling the position of the mold 6 (mold chuck 11) in the Z-axis direction. Next, the control unit 5 calculates a deviation 202 from the difference between the target position 201 and a measured value obtained by the first measurement unit 25. Next, the control unit 5 performs calculations in an arithmetic module 203, and generates a command value 204 for a driver 205 of the mold moving unit 12. Next, the driver 205 generates a current value 206 for driving the mold moving unit 12 based on the command value 204. The mold moving unit 12 generates a thrust (first thrust) based on the current value 206. Thus, the mold moving unit 12 can move the mold 6 in the Z-axis direction and can adjust the inclination of the mold 6. The substrate moving unit 21 is also controlled using the target position of the substrate chuck 19 and the measured value obtained by the second measurement unit 26. When a thrust (second thrust) is generated for the substrate chuck 19, the substrate moving unit 21 can move the substrate 10 in the Z-axis direction and can adjust the inclination of the substrate 10. The pressure adjustment unit 15 similarly controls the pressure in the space 13 by using the measurement result obtained by the pressure measurement unit (not illustrated) that measures the pressure in the space 13.

Figure 3:
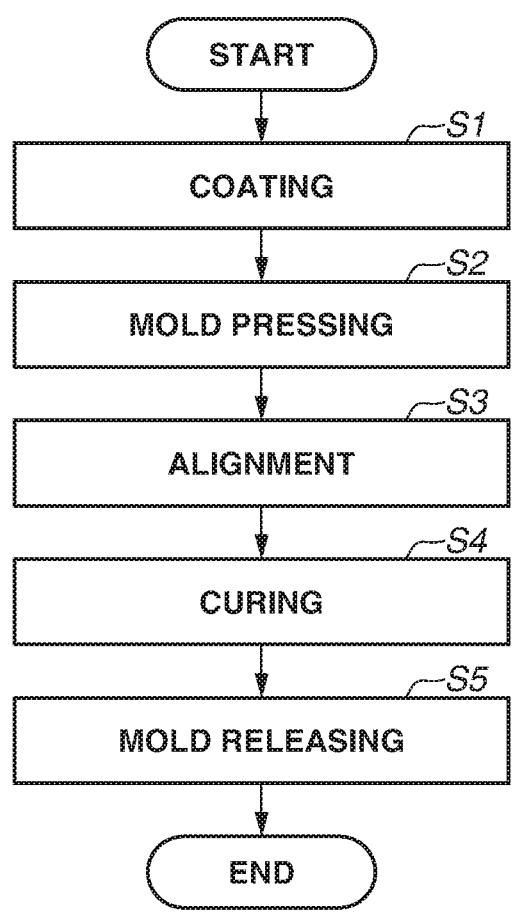
FIG. 3 is a flowchart illustrating an imprint process.

The imprint process in the imprint apparatus 1 will now be described. FIG. 3 is a flowchart illustrating the imprint process. In step S1, the control unit 5 causes the substrate holding mechanism 4 that holds the substrate 10 to move the substrate 10, and controls the imprint region on the substrate 10 to be positioned below the discharge unit 24. Further, the control unit 5 controls the discharge unit 24 to coat a region (imprint region) on the substrate 10 (coating step) with the imprint material 16.

Next, in step S2, the control unit 5 controls the substrate holding mechanism 4 to position the imprint region on the substrate 10 to which the material 16 is supplied, below the pattern portion 6a of the mold 6. Further, the control unit 5 controls the mold moving unit 12 to move the mold chuck 11 in the Z-axis direction so that the pattern portion 6a is pressed against the imprint material 16 on the imprint region (mold pressing step). In this case, the control unit 5 may cause the substrate moving unit 21 to move the substrate chuck 19 in the Z-axis direction. Further, the control unit 5 causes the pressure adjustment unit 15 to control the pressure in the space 13 by bringing the downward-convex pattern portion 6a of the mold 6 into contact with the imprint material 16 and by pressing the pattern portion 6a against the imprint material 16 while restoring the shape of the pattern portion 6a.

Next, in step S3, the control unit 5 moves the substrate holding mechanism 4 in a direction within the XY plane based on the measurement result of the alignment scope 23, and performs control to align the pattern portion 6a with the imprint region (alignment). Alternatively, the control unit 5 may move the mold holding mechanism 3 in a direction within the XY plane.

Next, in step S4, the control unit 5 controls the irradiation unit 2 to irradiate the imprint material 16 on the substrate 10 with light (curing step).

Next, in step S5, the control unit 5 moves at least one of the mold chuck 11 and the substrate chuck 19 in the Z-axis direction, thereby releasing the pattern portion 6a from the imprint material 16 on the substrate 10 (mold releasing step). If a plurality of imprint regions is present on the substrate 10, processes of steps S1 to S5 are repeatedly performed on the plurality of imprint regions on the substrate 10.

Thus, in the imprint process, the control unit 5 controls the position of at least one of the mold chuck 11 and the substrate chuck 19. However, an abnormality may occur in any one of the units of the imprint apparatus 1 during the imprint process, which makes it difficult for the control unit 5 to normally control the mold moving unit 12 or the substrate moving unit 21. For example, if an abnormality occurs in the mold chuck 11 or the measurement unit that measures the position of the substrate chuck 19, the mold moving unit 12 or the substrate stage 20 may generate an abnormal thrust. As a result, the pattern portion 6a of the mold 6 is pressed against the imprint material 16 on the substrate 10 with a larger force than a normal force, which may cause a damage to at least one of the mold 6 and the substrate 10. Further, if the mold chuck 11 or the substrate chuck 19 moves to an abnormal position or is inclined at an abnormal angle, at least one of the mold 6 and the substrate 10 may contact a member within the imprint apparatus 1 and may be damaged.

Figure 4:
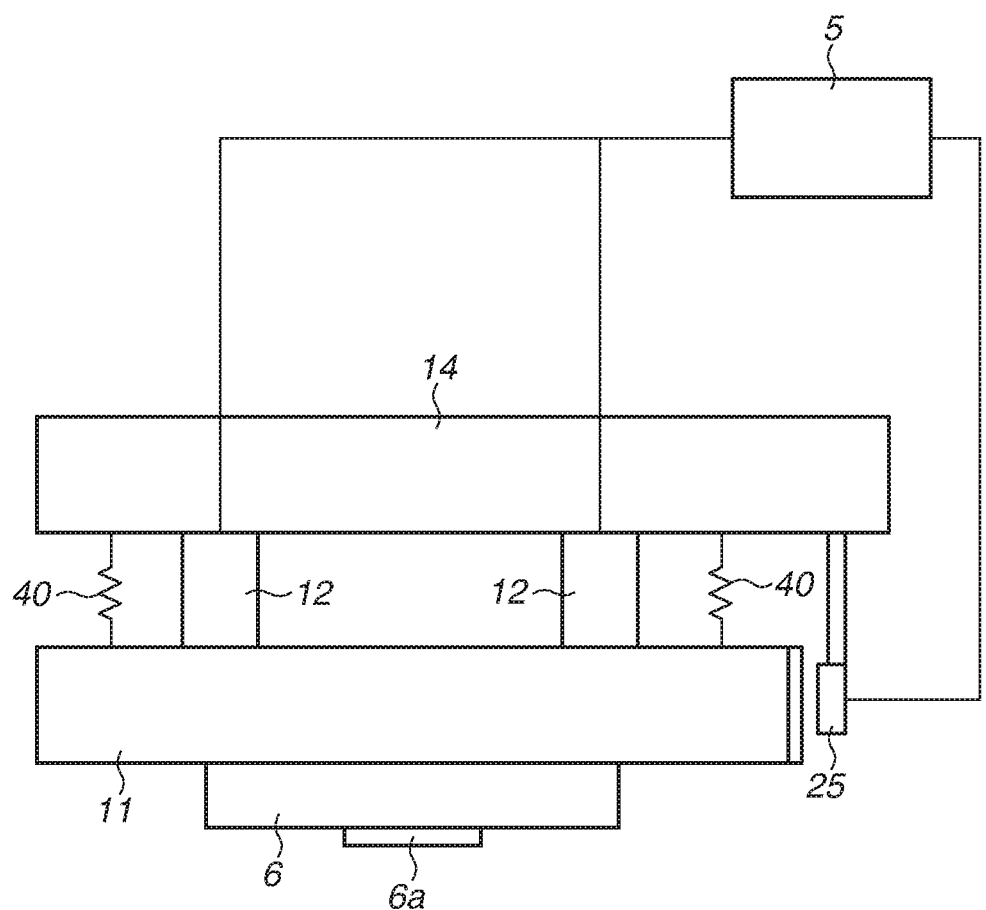

Therefore, the imprint apparatus 1 according to the present exemplary embodiment includes an elastic member 40 (first elastic member) that moves the mold chuck 11 to a position where the mold 6 and the substrate 10 do not contact, if an abnormality occurs. FIG. 4 illustrates the mold chuck 11, the elastic member 40, the control unit 5, and the like. The mold moving unit 12 and the elastic member 40 are disposed between the mold chuck 11 and the fixing unit 14. The elastic member 40 applies an elastic force to the mold chuck 11 in the +Z-axis direction. Examples of the elastic member 40 include a coil spring, a leaf spring, and rubber. The position (reference position) of the elastic member 40 where the weight of the mold chuck 11 matches the weight of the mold 6 is adjusted to be at a position where the mold 6 and the substrate 10 do not contact. When the distance between the mold chuck 11 and the substrate chuck 19 is shorter than a predetermined distance, the elastic member 40 applies an elastic force to the mold chuck 11 in a direction away from the substrate chuck 19. In the present case, the predetermined distance is the distance between the mold chuck 11 and the substrate chuck 19, but instead a position of the mold chuck 11 may be set in the Z-axis direction (a distance between a predetermined upper point and the mold chuck 11). In this case, when the position of the mold chuck 11 in the Z-axis direction is lower than the predetermined position, the elastic member 40 is disposed in such a manner that the elastic force acts on the mold chuck 11 in the direction away from the substrate chuck 19. The reference position is adjusted to be at a position where the mold 6 and the substrate 10 do not contact even when the pattern portion 6a of the mold 6 is deformed into a downward convex shape. Further, the reference position may be adjusted to be at a position where the mold 6 and the structure of the substrate holding mechanism 4 do not contact. Examples of the structure of the substrate holding mechanism 4 include a bar mirror and a scale as described above. This is because the structure of the substrate holding mechanism 4 can be disposed at a position higher than the substrate 10. The reference position may be adjusted in such a manner that, for example, the lower surface of the pattern portion 6a and the substrate 10 are spaced apart from the uppermost surface of the structure on the substrate stage 20 by 100 µm or more. More preferably, the reference position may be adjusted in such a manner that the lower surface of the pattern portion 6a and the substrate 10 are spaced apart from the uppermost surface of the structure on the substrate stage 20 by 200 µm or more.

For example, if an abnormality occurs in the control of the mold moving unit 12 during the imprint process described above with reference to FIG. 3, the control unit 5 adjusts a current supply to the mold moving unit 12 so as to set the thrust (first force) in the Z-axis direction to be smaller than the elastic force of the elastic member 40. As a result, the mold 6 held by the mold chuck 11 moves in the direction of the reference position where the mold 6 and the substrate 10 do not contact, i.e., in the direction in which the mold chuck 11 is separated from the substrate chuck 19. More preferably, if an abnormality occurs in the control of the mold moving unit 12, the control unit 5 interrupts the current supply to the mold moving unit 12 and the mold moving unit 12 sets the thrust to be generated to "0". Accordingly, the mold 6 held by the chuck 11 is moved to the reference position where the mold 6 and the substrate 10 do not contact, in the direction in which the mold chuck 11 is separated from the substrate chuck 19, thereby preventing the substrate 10 and the mold 6 from contacting each other.

The control unit 5 determines that an abnormality has occurred in the control of the mold holding mechanism 3, for example, when at least one piece of information which is used to control the mold holding mechanism 3 such as the deviation 202, the command value 204, and the current value 206 as illustrated in FIG. 2, becomes greater than a predetermined threshold. An abnormality in the control of the mold holding mechanism 3 is caused when, for example, the position of the mold holding mechanism 3 (mold chuck 11) cannot be accurately measured due to a failure in the first measurement unit 25, or when an abnormal current value 206 is generated due to a failure in the driving driver 205. Accordingly, by using information for controlling the mold holding mechanism 3, it can be determined that an abnormality has occurred in the control of the mold holding mechanism 3.

The control unit 5 may adjust the current supply to the mold moving unit 12, for example, if an abnormality occurs in the control of the substrate moving unit 21 during the imprint process. An abnormality that occurs in the substrate moving unit 21 can also be determined using at least one piece of information used for controlling the substrate holding mechanism 4, such as a deviation, a command value, and a current value, in the control of the substrate moving unit 21. Further, the control unit 5 may adjust the current supply to the mold moving unit 12, for example, if an abnormality occurs in the control of the pressure adjustment unit 15, during the imprint process. An abnormality that occurs in the pressure adjustment unit 15 can also be determined using at least one piece information used for controlling the pressure adjustment unit 15, such as a deviation, a command value, and a current value, in the control of the pressure adjustment unit 15.

Figure 5:
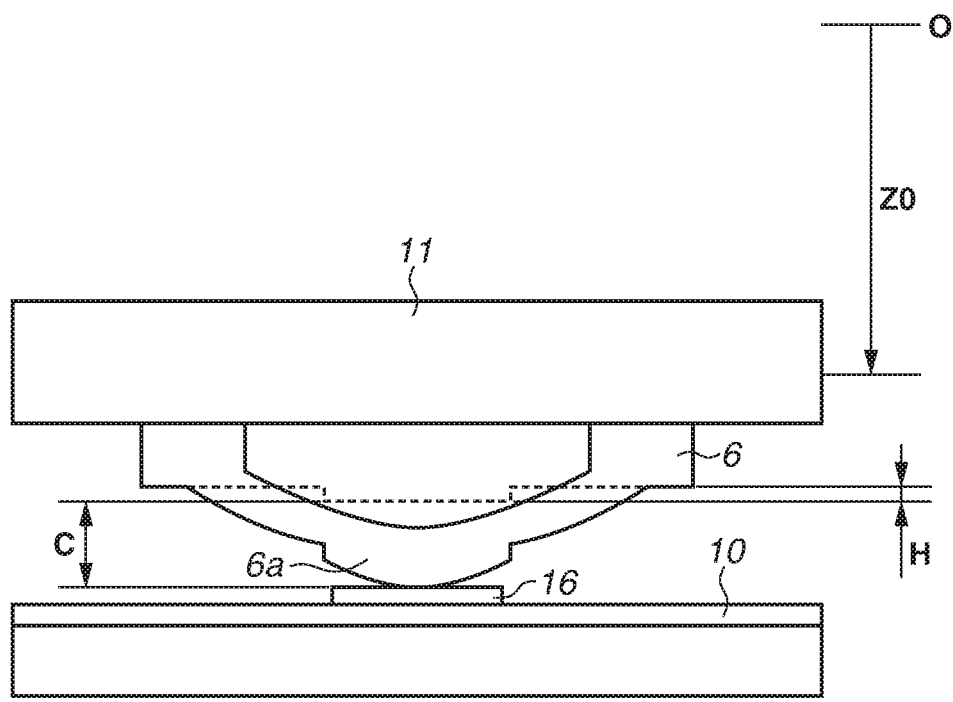
FIG. 5 illustrates the position of the mold holding unit.

Further, the control unit 5 may determine that an abnormality has occurred in the control of the mold holding mechanism 3 when the position of the mold chuck 11 descends to a position lower than a predetermined position during the imprint process. In other words, the control unit 5 may determine that an abnormality has occurred in the control of the mold holding mechanism 3 when the distance between the mold chuck 11 and the substrate chuck 19 becomes shorter than a predetermined distance. FIG. 5 illustrates the position of the mold chuck 11. Step S2 illustrated in FIG. 3 indicates a state where the mold chuck 11 is located at a position Z0 in the Z-axis direction. In the state where the mold chuck 11 is located at the position Z0, a lowermost point of the pattern portion 6a which is convex downward contacts the imprint material 16 on the substrate 10. After that, the control unit 5 controls the mold moving unit 12 to cause the mold 6 (mold chuck 11) to descend downward while controlling the pressure adjustment unit 15 to restore the shape of the pattern portion 6a into an original shape (planar shape). When the mold chuck 11 descends to a position lower by a deformation amount C (C>0) of the mold 6 from the position Z0, the shape of the pattern portion 6a is restored into the planar shape. In this case, the deformation amount C of the mold 6 is a deformation amount of the mold 6 immediately before the pattern portion 6a contacts the imprint material 16 on the substrate 10. The deformation amount C is preliminarily obtained as a certain value based on the pressure value in the space 13, the rigidity of the mold 6, and the area of a section taken along the XY plane of the space 13 (cross-sectional area of the space 13).

The deformation amount C may be preliminarily obtained by an experiment, simulation, or the like. A dotted line illustrated in FIG. 5 indicates an outer shape of the mold 6 when the pattern portion 6a takes a planar shape. Accordingly, the control unit 5 controls the mold chuck 11 to stop when the position of the mold chuck 11 reaches a position Z0-C.

In this case, if an abnormality occurs in the control of the mold holding mechanism 3 and the position of the mold chuck 11 descends to a lower position by a certain distance from the position Z0, the peripheral surface of the pattern portion 6a may contact the substrate 10. If the peripheral surface of the pattern portion 6a contacts the substrate 10, there is a possibility that the pattern formed on the substrate 10 may be deformed, or at least one of the mold 6 and the substrate 10 may be damaged. Accordingly, the control unit 5 determines that an abnormality has occurred in the control of the mold moving unit 12 when the position of the mold chuck 11 descends to a position lower than a predetermined position Ze. The control unit 5 determines that an abnormality has occurred in the control of the mold moving unit 12 when the position of the mold chuck 11 satisfies Ze=Z0-C-H, where the certain distance is represented by H (H>0). In this case, the control unit 5 can obtain the position Z0 based on the position of the mold chuck 11 when a variation occurs in the deviation 202, the command value 204, or the like due to a contact between the pattern portion 6a and the imprint material 16 on the substrate 10. As illustrated in FIG. 5, the distance between the surface of the pattern portion 6a and the peripheral surface of the pattern portion 6a when the pattern portion 6a takes a planar shape can be set as the distance H. The distance H is, for example, 30 μm. The distance H may be preliminarily obtained by an experiment, simulation, or the like, and may be, for example, 15 μm. By taking into consideration the distance H, it is possible to prevent the control unit 5 from erroneously determining that an abnormality has occurred, due to an error in the control of the mold chuck 11.

As described above, in the imprint apparatus 1 according to the present exemplary embodiment, if an abnormality occurs in the control of the mold moving unit 12 or the like, the mold chuck 11 that holds the mold 6 is moved by the elastic member 40, thereby preventing the mold 6 or the substrate 10 from being damaged.

A second exemplary embodiment illustrates an example which uses an imprint apparatus that forms a pattern on a substrate as a molding apparatus that molds a composition on a substrate with a mold. constituents that are not described in the second exemplary embodiment are similar to the first exemplary embodiment. The second exemplary embodiment illustrates an exemplary embodiment in which, if an abnormality occurs in the mold holding unit or the like, the substrate holding unit that holds the substrate 10 is moved to a position where the mold 6 and the substrate 10 do not contact.

Figure 6:
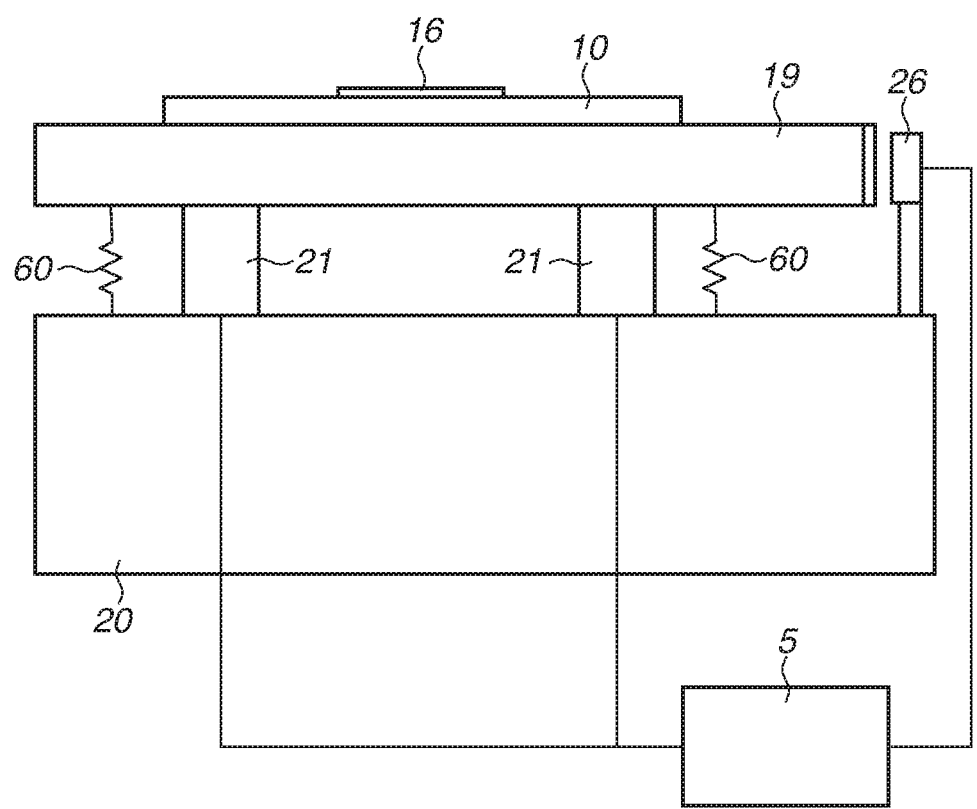

The imprint apparatus 1 according to the present exemplary embodiment includes an elastic member (second elastic member) 60 that causes the substrate chuck 19 to move to a position where the mold 6 and the substrate 10 do not contact if an abnormality occurs in the control. FIG. 6 illustrates the substrate chuck 19, the elastic member 60, the control unit 5, and the like. The substrate moving unit 21 and the elastic member 60 are disposed between the substrate chuck 19 and the substrate stage 20. The elastic member 60 applies an elastic force to the substrate chuck 19 in the −Z-axis direction. Examples of the elastic member 60 can include a coil spring, a leaf spring, and rubber. The position (reference position) of the elastic member 60 where the weight of the mold chuck 19 matches the weight of the substrate 10 is adjusted to a position where the mold 6 and the substrate 10 do not contact. When the distance between the substrate chuck 19 and the mold chuck 11 is shorter than a predetermined distance, the elastic member 60 applies an elastic force to the substrate chuck 19 in a direction away from the mold chuck 11. In the present case, the predetermined distance is the distance between the substrate chuck 19 and the mold chuck 11, but the distance is not limited thereto, and may be the position of the substrate chuck 19 in the Z-axis direction (distance between a predetermined upward point and the substrate chuck 19). In this case, when the position of the substrate chuck 19 in the Z-axis direction is higher than the predetermined position, the elastic member 60 is placed in such a manner that the elastic force in the direction away from the mold chuck 11 acts on the substrate chuck 19. Also, when the pattern portion 6a of the mold 6 is deformed into a downward convex shape, the reference position is adjusted to take a position where the mold 6 and the substrate 10 do not contact. Further, the reference position may be adjusted to take a position where the mold 6 and the structure of the substrate holding mechanism 4 do not contact.

For example, if an abnormality occurs in the control of the substrate moving unit 21 during the imprint process illustrated in FIG. 3, the control unit 5 adjusts a current supply to the substrate moving unit 21 to set the thrust in the Z-axis direction to be smaller than the elastic force of the elastic member 60. As a result, the substrate 10 held by the substrate chuck 19 moves in the direction of the reference position where the mold 6 and the substrate 10 do not contact, i.e., in the direction in which the substrate chuck 19 is separated from the mold chuck 11. Preferably, if an abnormality occurs in the control of the substrate moving unit 21, the control unit 5 moves to a position where the substrate 10 does not contact the mold 6. More preferably, the control unit 5 interrupts the current supply to the substrate moving unit 21, and sets thrust generated by the substrate moving unit 21 to "0". As a result, the substrate chuck 19 moves in the direction away from the mold chuck 11 and the substrate 10 held by the substrate chuck 19 moves to the reference position where the mold 6 and the substrate 10 do not contact, thereby preventing the substrate 10 and the mold 6 from contacting each other.

Thus, in the imprint apparatus according to the present exemplary embodiment, if an abnormality occurs in the control of the mold moving unit or the like, the substrate chuck 19 that holds the substrate 10 is moved by the elastic member 60, thereby preventing the mold 6 or the substrate 10 from being damaged.

A third exemplary embodiment illustrates an example in which a planarization apparatus that performs a formation process for forming a planarization layer on a substrate is used as a molding apparatus that molds a composition on a substrate with a mold. Constituents that are not described in the third exemplary embodiment are similar to the description of the first and second exemplary embodiments.

While a mold for transferring a circuit pattern provided with a concave-convex pattern is described as the mold 6 in the first exemplary embodiment, the mold 6 may instead be a mold (planar template) including a planar portion with no concave-convex pattern. The planar template is used for the planarization apparatus (molding apparatus) that performs a planarization process (molding process) for performing molding such that the planar portion planarizes the composition on the substrate. The planarization process includes a step of curing a curable composition by irradiation with light or by heating, in a state where a flat portion of the planar template is brought into contact with the curable composition supplied onto the substrate.

In the planarization apparatus, the planarization layer is formed on the substrate with use of the planar template. A base pattern on the substrate includes a concave-convex profile derived from a pattern formed in the previous step. In particular, along with the recent advancement in multi-layer structure of memory elements, a process substrate having a step of about 100 nm has come into being. The step formed due to a gentle swell of the entire substrate can be corrected by a focus following function of a scan exposure apparatus that is used in a photo step. However, a concave-convex pattern with a fine pitch that can fit into an exposure slit area of the exposure apparatus directly consumes the Depth Of Focus (DOF) of the exposure apparatus. As a conventional technique for smoothing a base pattern of a substrate, a technique of forming a planarization layer, such as Spin On Carbon (SOC) or Chemical Mechanical Polishing (CMP), is used. However, the conventional technique has a problem that a sufficient planarization performance cannot be obtained, and the difference in concave and convex shapes of the base pattern tends to further increase in the future due to an increase in the number of layers.

To solve this problem, the planarization apparatus according to the present exemplary embodiment performs local planarization within the surface of the substrate by pressing the planar template (planar plate) against the uncured composition that is preliminarily coated on the substrate. In the present exemplary embodiment, the configuration of the planarization apparatus may be substantially the same as the imprint apparatus 1 illustrated in FIG. 1. However, in the planarization apparatus, a planar plate with an area that is larger or equal to the substrate is used instead of the mold including the pattern portion with the concave-convex pattern formed thereon, and the planar plate is brought into contact with the entire surface of the composition layer on the substrate. The mold holding unit is configured to hold the planar plate as described above.

Figure 7A:
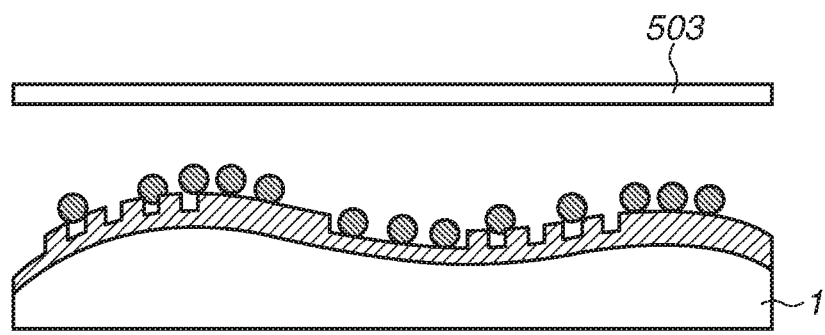
FIGS. 7A, 7B, and 7C each illustrate a process to be performed by a planarization apparatus.
Figure 7B:
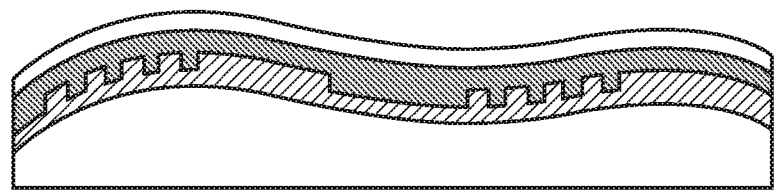
Figure 7C:
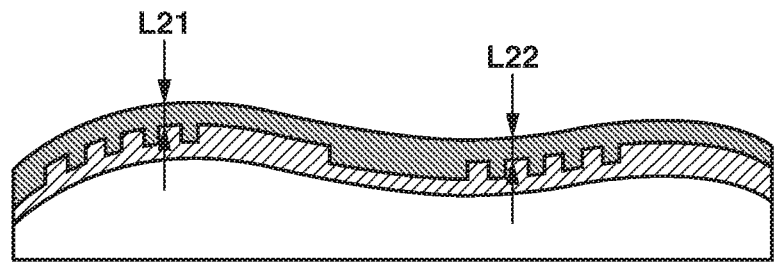

FIGS. 7A to 7C each illustrate a process to be performed by the planarization apparatus according to the present exemplary embodiment. FIG. 7A illustrates a state before the composition is supplied onto the substrate and a planar plate 503 is brought into contact with the composition. The supply pattern of the composition is calculated in consideration of information about the concave-convex pattern on the entire surface of the substrate. FIG. 7B illustrates a state where the planar plate 503 contacts the composition on the substrate. FIG. 7C illustrates a state where the planar plate 503 is removed after the composition is cured by irradiating the composition with light.

As described above, since an actual substrate has not only steps of a pattern, but also concave and convex shapes on the entire surface of the substrate, the timing that the planar plate 503 contacts the composition varies due to the concave and convex shapes. In the present exemplary embodiment, the composition starts to move immediately after the contact at a first contact position, and a larger amount of composition is given correspondingly. At a last contact position, movement of the composition starts late and the composition flowing in from the peripheral area is added, so that the amount of composition is reduced correspondingly. With this countermeasure, the planarization layer can be formed with a uniform thickness on the entire surface of the substrate.

The disclosure according to the first and second exemplary embodiments can also be applied to the planarization apparatus according to the present exemplary embodiment.

(Article Manufacturing Method)

A pattern of a cured material formed using the imprint apparatus is permanently used for at least a part of various articles, or is temporarily used for manufacturing various articles. Examples of the articles include an electrical circuit element, an optical element, Micro Electro Mechanical Systems (MEMS), a recording element, a sensor, and a mold. Examples of the electrical circuit include a dynamic random-access memory (DRAM), a static RAM (SRAM), a flash memory, a magnetic RAM (MRAM), volatile or non-volatile semiconductor memories, and semiconductor elements such as a large-scale integration (LSI), a charge-coupled device (CCD), an image sensor, and a Field Programmable Gate Array (FPGA). Examples of the mold include a mold for imprinting.

The pattern of the cured material is directly used as a member of at least a part of the articles, or is temporarily used as a resist mask. The resist mask is removed after etching, ion implantation, or the like is carried out in a substrate processing step.

Figure 8A:
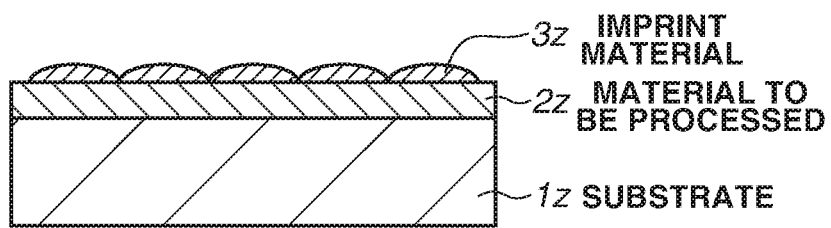
FIGS. 8A to 8F each illustrate an article manufacturing method.

Next, a specific manufacturing method of the article will be described. As illustrated in FIG. 8A, a substrate 1z such as a silicon wafer is prepared with a material 2z to be processed such as an insulating material, formed on a wafer surface, and an imprint material 3z is applied to the surface of the material 2z to be processed, by an inkjet method or the like. FIG. 8A illustrates a state where the imprint material 3z is applied onto the substrate in form of a plurality of droplets.

Figure 8B:
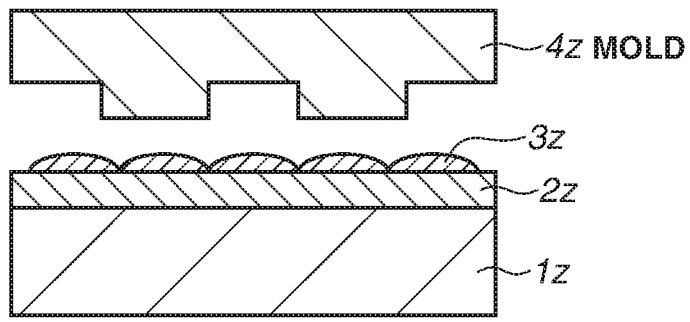
Figure 8C:
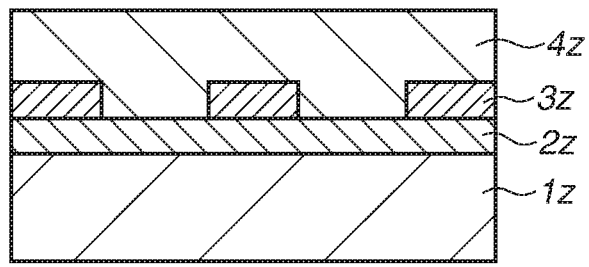

As illustrated in FIG. 8B, an imprinting side of a mold 4z on which a concave-convex pattern is formed is opposed to the imprint material 3z on the substrate. As illustrated in FIG. 8C, the substrate 1z to which the imprint material 3z is applied is brought into contact with the mold 4z, and a pressure is applied. A gap between the mold 4z and the material 2z to be processed is filled in with the imprint material 3z. In this state, the imprint material 3z is irradiated with light serving as a curing energy through the mold 4z, to thereby cure the imprint material 3z.

Figure 8D:
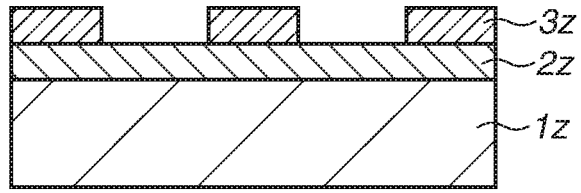

As illustrated in FIG. 8D, the mold 4z is released from the substrate 1z after the imprint material 3z is cured, so that the pattern of the cured material of the imprint material 3z is formed on the substrate 1z. The pattern of the cured material has a shape in which a concave portion of the mold corresponds to each convex portion of the cured material, and a convex portion of the mold corresponds to a concave portion of the cured material. That is, the concave-convex pattern of the mold 4z is transferred onto the imprint material 3z.

Figure 8E:
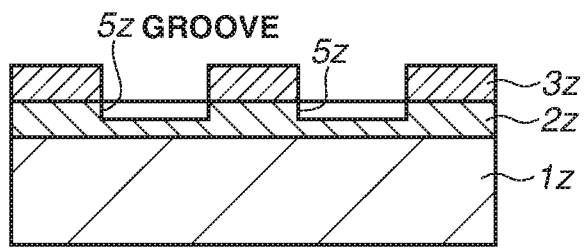
Figure 8F:
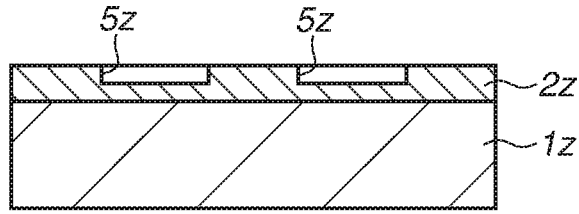

As illustrated in FIG. 8E, when etching is performed on the pattern of the cured material that is an etching-resistant mask, portions where no cured material or only a slight amount of the cured material is formed on the surface of the material to be processed 2z, are removed, so that grooves 5z are formed. As illustrated in FIG. 8F, when the pattern of the cured material is removed, the article having the grooves 5z formed on the surface of the processed material 2z can be obtained. In this case, the pattern of the cured material is removed. However, without removing the pattern of the cured material after the processing, the pattern of the cured material may be used as a film for interlayer insulation to be included in a semiconductor element or the like, i.e., as a member of the article.

Although a mold for circuit pattern transfer provided with a concave-convex pattern is used as the mold 4z has been described above as an example, a mold (blank template) that includes a planar portion with no concave-convex pattern may be used. The blank template is used for the planarization apparatus (molding apparatus) that performs the planarization process (molding process) for performing molding such that the composition is planarized on the substrate by the planar portion. The planarization process includes a step of curing a curable composition by irradiation with light or heating in a state where a flat portion of the blank template is brought into contact with the curable composition supplied onto the substrate.

While exemplary embodiments have been described above, the present disclosure is not limited to the exemplary embodiments, and various modifications and alterations can be made within the scope of the present disclosure.

As an example of the molding apparatus, the imprint apparatus that forms a pattern on a substrate by molding an imprint material on the substrate with a mold has been described above. However, the molding apparatus according to the present disclosure is not limited to the imprint apparatus. As an example of the molding apparatus, a planarization apparatus that performs a planarization process (molding process) for performing molding such that a composition is planarized on a substrate with the mold (blank template) which includes the planar portion with no concave-convex pattern may be used.

The first to third exemplary embodiments can be carried out singly or by combining any of the first to third exemplary embodiments.

According to exemplary embodiments, it is possible to provide a molding apparatus and an article manufacturing method which are capable of preventing a mold or a substrate from being damaged.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-111218, filed Jun. 11, 2018, which is hereby incorporated by reference herein in its entirety.

What is claimed is:

1. A molding apparatus that molds a composition on a substrate with a mold, the molding apparatus comprising:
a mold chuck configured to hold the mold using a vacuum suction force or electrostatic force;
a substrate chuck configured to hold the substrate using an attraction force;
a first elastic member including at least one of a coil spring, a leaf spring, and rubber and configured to apply a first elastic force to the mold chuck in a direction away from the substrate chuck; and
a control unit including a processing unit and a memory and configured to cause the mold chuck to move in the direction away from the substrate chuck in a case where the control unit determines that an abnormality has occurred.

2. The molding apparatus according to claim 1, wherein the control unit determines that the abnormality has occurred based on information used for controlling the mold chuck.

3. The molding apparatus according to claim 2, further comprising a first measurement unit including at least one of a laser interferometer and an encoder and configured to measure a position of the mold chuck,
wherein the information used for controlling the mold chuck includes a difference between the position of the mold chuck measured by the first measurement unit and a target position of the mold chuck.

4. The molding apparatus according to claim 1, wherein the control unit determines that the abnormality has occurred based on a distance between the substrate chuck and the mold chuck.

5. The molding apparatus according to claim 1, wherein the control unit determines that the abnormality has occurred in a case where a position of the mold chuck in the direction exceeds a position apart from the position of the mold chuck by a certain distance when the mold held by the mold chuck contacts the composition on the substrate held by the substrate chuck.

6. The molding apparatus according to claim 5, wherein the certain distance is determined based on a deformation amount of the mold in the direction.

7. The molding apparatus according to claim 1,
wherein the control unit is configured to apply a first force to the mold chuck in another direction in which the mold chuck approaches the substrate chuck, in a case where the control unit determines that the abnormality has occurred, and
wherein a magnitude of the first force is smaller than a magnitude of the first elastic force.

8. The molding apparatus according to claim 1, further comprising a second elastic member including at least one of a coil spring, a leaf spring, and rubber and configured to apply a second elastic force to the substrate chuck in another direction away from the mold chuck,
wherein the control unit causes the substrate chuck to move in the other direction away from the mold chuck in a case where the control unit determines that the abnormality has occurred.

9. The molding apparatus according to claim 8, wherein the control unit determines that the abnormality has occurred based on information used for controlling the substrate chuck.

10. The molding apparatus according to claim 9, further comprising a second measurement unit including at least one of a laser interferometer and an encoder and configured to measure a position of the substrate chuck,
wherein the information used for controlling the substrate chuck includes a difference between the position of the substrate chuck measured by the second measurement unit and a target position of the substrate chuck.

11. A molding apparatus that molds a composition on a substrate with a mold, the molding apparatus comprising:
a mold chuck configured to hold the mold using a vacuum suction force or electrostatic force;
a substrate chuck configured to hold the substrate using an attraction force;
an elastic member including at least one of a coil spring, a leaf spring, and rubber and configured to apply an elastic force to the substrate chuck in a direction away from the mold chuck; and
a control unit including a processing unit and a memory and configured to cause the substrate chuck to move in the direction away from the mold chuck in a case where the control unit determines that an abnormality has occurred.

12. The molding apparatus according to claim 11, wherein the control unit determines that the abnormality has occurred based on information used for controlling the substrate chuck.

13. The molding apparatus according to claim 1, wherein the molding apparatus brings a pattern of the mold into contact with the composition to form a pattern of the composition.

14. The molding apparatus according to claim 1, wherein the molding apparatus brings a planar portion of the mold into contact with the composition to make the composition flat.

* * * * *